United States Patent
Fu

(10) Patent No.: US 9,270,283 B2
(45) Date of Patent: Feb. 23, 2016

(54) FREQUENCY GENERATION DEVICE

(71) Applicant: Semiconductor Manufacturing International (Shanghai) Corporation, Shanghai (CN)

(72) Inventor: Zhigang Fu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/266,337

(22) Filed: Apr. 30, 2014

(65) Prior Publication Data

US 2014/0368282 A1 Dec. 18, 2014

(30) Foreign Application Priority Data

Jun. 18, 2013 (CN) .......................... 2013 1 0240077
Sep. 23, 2013 (CN) .......................... 2013 1 0433310

(51) Int. Cl.
| | |
|---|---|
| H03L 7/00 | (2006.01) |
| H03L 7/06 | (2006.01) |
| H03L 7/099 | (2006.01) |
| H03L 7/02 | (2006.01) |
| H03L 7/10 | (2006.01) |

(52) U.S. Cl.
CPC ...... *H03L 7/06* (2013.01); *H03L 7/02* (2013.01); *H03L 7/099* (2013.01); *H03L 7/105* (2013.01); *H03L 2207/00* (2013.01)

(58) Field of Classification Search
CPC ............. H03L 7/06; H03L 7/02; H03L 7/105; H03L 7/099; H03L 2207/00
USPC ............... 331/1 R, 17, 18, 34, 111, 143, 175, 331/177 R
See application file for complete search history.

(56) References Cited

U.S. PATENT DOCUMENTS

| | | | | |
|---|---|---|---|---|
| 4,340,864 A | * | 7/1982 | Malinowski | ......... G01R 23/005 327/113 |
| 4,868,689 A | * | 9/1989 | Egami et al. | ..................... 360/32 |
| 7,218,086 B1 | * | 5/2007 | Ritter et al. | ................... 323/303 |
| 7,911,285 B2 | * | 3/2011 | Terada et al. | ................. 331/158 |
| 8,130,046 B2 | * | 3/2012 | Kwok | ............................. 331/16 |
| 2004/0000956 A1 | * | 1/2004 | Jaehne et al. | ................... 331/16 |
| 2010/0085121 A1 | | 4/2010 | Fievet et al. | |
| 2010/0214029 A1 | | 8/2010 | McDonald et al. | |
| 2010/0289590 A1 | | 11/2010 | Von Staudt et al. | |

OTHER PUBLICATIONS

B. Robert Gregoire and Un-Ku Moon, "A Sub 1-V Constant GM-C Switched-Capacitor Current Source", IEEE Transactions on Circuits and Systems—II: Express Briefs, vol. 54, No. 3, Mar. 2007.

* cited by examiner

*Primary Examiner* — Richard Tan
(74) *Attorney, Agent, or Firm* — Innovation Counsel LLP

(57) ABSTRACT

A frequency generation device is provided. The frequency generation device includes a voltage generation unit configured to receive an input signal having an input frequency and to generate a feedback voltage based on the input signal, wherein the feedback voltage is proportional to the input frequency; and a feedback unit connected to the voltage generation unit and a reference voltage source, wherein the feedback unit is configured to receive a reference voltage from the reference voltage source and the feedback voltage from the voltage generation unit, so as to generate a feedback signal having a feedback frequency.

21 Claims, 5 Drawing Sheets

FREQUENCY GENERATION DEVICE

CROSS-REFERENCE TO RELATED APPLICATIONS

This application claims priority to Chinese Patent Application No. 201310433310.8 filed on Sep. 23, 2013 and titled "Frequency Generation Device, Method and Apparatus," and Chinese Patent Application No. 201310240077.1 filed on Jun. 18, 2013 and titled "Frequency Generation Device, Method and Apparatus," both of which are incorporated herein by reference in their entirety.

BACKGROUND

1. Technical Field

The present disclosure relates to a frequency generation device and a method of generating an output frequency using the frequency generation device.

2. Description of the Related Art

An oscillator is an electronic device capable of generating a periodic signal having an oscillation frequency (for example, a sine wave or a square wave).

There are many different types of oscillators, such as ring oscillators, resistance capacitance (RC) oscillators, crystal oscillators, etc.

A ring oscillator may include a circuit having a gate propagation delay time that can be modified to produce a desired oscillation frequency. The gate propagation delay time may be modified, for example, by changing the number of gate circuits in the ring oscillator circuit, or by connecting a capacitor and a resistor between the gate circuits, so as to adjust the oscillation frequency.

Similarly, the oscillation frequency of a resistance capacitance (RC) oscillator can be adjusted by changing the capacitance or resistance value of the gate circuits in the RC-type oscillator.

Ring oscillators and RC oscillators are widely used in electronic devices due to their low cost. However, the frequencies generated by the ring oscillators and the RC oscillators may lack the accuracy required for some applications. For example, the accuracy of a ring oscillator is within ±50% before trimming, and within ±5% after trimming, which may not be accurate enough for certain applications.

A crystal oscillator typically includes a quartz crystal. Due to advances in the crystal cutting process, the crystal oscillator may have a more precise and stable oscillation frequency compared to the ring oscillator or RC oscillator. However, the crystal oscillator is typically more expensive than the ring oscillator and the RC oscillator. As a result, the use of a crystal oscillator may increase device costs.

In some oscillators, the oscillation frequency may be automatically adjusted using digital control. For example, U.S. Patent Application Publication No. 2010/0085121 A1 discloses an auto trimming oscillator including a Successive Approximation Register (SAR) that is used to iteratively trim the oscillator output clock frequency based on a difference between a reference clock frequency and the oscillator output clock frequency. Specifically, the output frequency of a voltage controlled oscillator signal may be adjusted by modifying the oscillation frequency and comparing the modified oscillation frequency with the reference clock frequency.

SUMMARY

The present disclosure is directed to improve the accuracy of the frequency generated by an oscillator.

According to some embodiments of the inventive concept, a frequency generation device is provided. The frequency generation device includes a voltage generation unit configured to receive an input signal having an input frequency and to generate a feedback voltage based on the input signal, wherein the feedback voltage is proportional to the input frequency; and a feedback unit connected to the voltage generation unit and a reference voltage source, wherein the feedback unit is configured to receive a reference voltage from the reference voltage source and the feedback voltage from the voltage generation unit, so as to generate a feedback signal having a feedback frequency.

In some embodiments, the feedback signal may be provided to the voltage generation unit as the input signal such that the input frequency corresponds to the feedback frequency, and wherein the feedback unit may be further configured to generate an output frequency by adjusting the feedback frequency of the feedback signal based on a difference between the reference voltage and the feedback voltage.

In some embodiments, the frequency generation device may further include a frequency selection unit configured to select the input frequency from one of the feedback frequency and the reference frequency, depending on whether the frequency selection unit is in a reference setting mode or a frequency generating mode.

In some embodiments, the frequency selection unit may be configured to select the reference frequency as the input frequency when the frequency selection unit is in the reference setting mode, and wherein the voltage generation unit may be further configured to receive the input signal having the reference frequency from the frequency selection unit, and to output a first voltage to the feedback unit based on the reference frequency.

In some embodiments, the frequency selection unit may be configured to select the feedback frequency as the input frequency when the frequency selection unit is in the frequency setting mode, and wherein the voltage generation unit may be further configured to receive the input signal having the feedback frequency from the frequency selection unit, and output the feedback voltage to the feedback unit based on the feedback frequency.

In some embodiments, the reference voltage may be substantially equal to the first voltage.

In some embodiments, the feedback unit may be further configured to increase the feedback frequency of the feedback signal by a predetermined amount when the difference between the reference voltage and the feedback voltage is greater than zero, and decrease the feedback frequency of the feedback signal by the predetermined amount when the difference between the reference voltage and the feedback voltage is less than zero.

In some embodiments, the feedback frequency of the feedback signal may remain unchanged when the difference between the reference voltage and the feedback voltage is substantially equal to zero.

In some embodiments, the feedback unit may further include an operational amplifier connected to the reference voltage source and the voltage generation unit, wherein the operation amplifier maybe configured to output a signal d based on a voltage difference between the reference voltage and the feedback voltage; and a voltage-controlled oscillator may be configured to receive the signal d, and to generate an output frequency by adjusting the feedback frequency of the feedback signal based on the signal d.

In some embodiments, the signal d may be used to indicate whether the voltage difference between the reference voltage and the feedback voltage is positive, negative, or zero.

In some embodiments, the voltage-controlled oscillator maybe configured to increase the feedback frequency of the feedback signal by a predetermined amount when the signal d indicates that the voltage difference between the reference voltage and the feedback voltage is positive, and decrease the feedback frequency of the feedback signal by the predetermined amount when the signal d indicates that the voltage difference between the reference voltage and the feedback voltage is negative.

In some embodiments, the feedback frequency of the feedback signal may remain unchanged when the signal d indicates that the voltage difference between the reference voltage and the feedback voltage is substantially equal to zero.

In some embodiments, the reference voltage source may further include a bandgap voltage source configured to generate a constant bandgap voltage, and a voltage divider configured to divide the bandgap voltage to obtain the reference voltage.

In some embodiments, the voltage generation unit may further include a switched-capacitor current source and a resistor, wherein the switched-capacitor current source maybe configured to generate a current that is proportional to the bandgap voltage and the input frequency of the voltage generation unit, and wherein the voltage generation unit may be configured to generate the feedback voltage when the current flows across the resistor; and a non-overlapping clock generator may be configured to generate a first clock signal and a second clock signal for driving the switched-capacitor current source, wherein the first and second clock signals may be generated based on the input signal having the input frequency received from the frequency selection unit.

In some embodiments, the switched-capacitor current source may comprise a plurality of capacitors including a discharging capacitor, and wherein the current generated by the switched-capacitor current source may be given by:

$$Ib = 2 \times Vbg \times C1 \times fi,$$

where Ib corresponds to the current generated by the switched-capacitor current source, Vbg corresponds to the bandgap voltage, C1 corresponds to a capacitance value of the discharging capacitor, and fi corresponds to the input frequency.

According to some other embodiments of the inventive concept, a method of generating an output frequency using a frequency generation device is provided. The method includes setting a reference frequency, wherein setting the reference frequency includes providing a reference voltage having a reference frequency to a voltage generation unit, and setting the reference voltage to be equal to a first voltage generated by the voltage generation unit; and generating a feedback frequency, wherein generating the feedback frequency includes providing a feedback voltage from the voltage generation unit to a feedback unit, and generating a feedback signal having the feedback frequency by the feedback unit.

In some embodiments, the feedback frequency may be proportional to the feedback voltage, and the method may further include generating the output frequency by adjusting the feedback frequency of the feedback signal based on a difference between the reference voltage from the reference voltage source and the feedback voltage from the voltage generation unit.

In some embodiments, the method may further include increasing the feedback frequency of the feedback signal by a predetermined amount when the difference between the reference voltage and the feedback voltage is greater than zero, and decreasing the feedback frequency of the feedback signal decreases by the predetermined amount when the difference between the reference voltage and the feedback voltage is less than zero.

In some embodiments of the method, the feedback frequency of the feedback signal may remain unchanged when the difference between the reference voltage and the feedback voltage is substantially equal to zero.

According to some further embodiments of the inventive concept, a non-transitory computer-readable medium storing instructions that, when executed, causes a frequency generation device to perform a method for generating an output frequency is provided. The method includes setting a reference frequency, wherein setting the reference frequency includes providing a reference voltage having a reference frequency to a voltage generation unit, and setting the reference voltage to be equal to a first voltage generated by the voltage generation unit; and generating a feedback frequency, wherein generating the feedback frequency includes providing a feedback voltage from the voltage generation unit to a feedback unit, and generating a feedback signal having the feedback frequency by the feedback unit.

In some embodiments of the non-transitory computer-readable medium, the feedback frequency may be proportional to the feedback voltage, and the method may further include generating the output frequency by adjusting the feedback frequency of the feedback signal based on a difference between the reference voltage from the reference voltage source and the feedback voltage from the voltage generation unit.

The objects, features, and advantages of the inventive concept will be apparent from the following detailed description of the different embodiments with reference to the accompanying drawings.

BRIEF DESCRIPTION OF THE DRAWINGS

The accompanying drawings, which are incorporated herein and constitute a part of the specification, illustrate different embodiments of the inventive concept and, together with the description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments, do not limit the scope of the inventive concept unless otherwise specifically stated. In addition, techniques, methods, and devices as known by those skilled in the art, although omitted in some instances, are intended to be part of the specification where appropriate.

Figure 1:
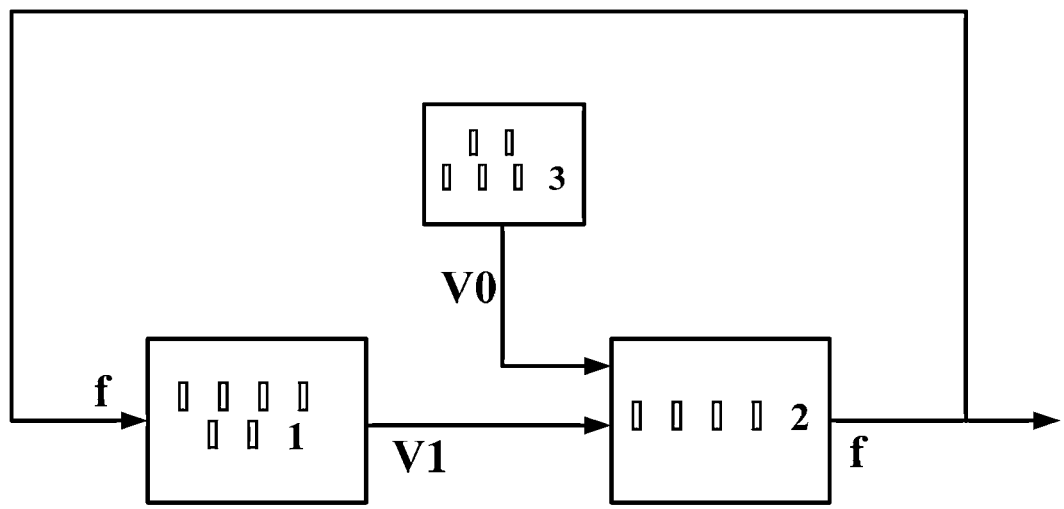
FIG. 1 is a schematic diagram illustrating a frequency generation device according to an embodiment of the inventive concept.

FIG. 1 is a schematic diagram illustrating a frequency generation device according to an embodiment of the inventive concept. Referring to FIG. 1, the frequency generation device includes a voltage generation unit 1, a feedback unit 2, and a reference voltage source 3.

The voltage generation unit 1 is configured to receive an input signal having an input frequency fi. In some embodiments, the input frequency fi may correspond to a feedback frequency f, as depicted in FIG. 1. The voltage generation unit 1 is further configured to output a feedback voltage V1 based on the input signal. The feedback voltage V1 may be proportional to the feedback frequency f.

The reference voltage source 3 is configured to output a reference voltage V0 to the feedback unit 2.

The feedback unit 2 includes a first input terminal and a second input terminal. The first input terminal of the feedback unit 2 is connected to an output terminal of the voltage generation unit 1. The second input terminal of the feedback unit 2 is connected to an output terminal of the reference voltage source 3. The feedback unit 2 is configured to receive the reference voltage V0 (from the reference voltage source 3) and the feedback voltage V1 (from the voltage generation unit 1), so as to output a feedback signal having the feedback frequency f.

An output terminal of the feedback unit 2 may be connected to an input terminal of the voltage generation unit 1 via a feedback loop, such that the voltage generation unit 1 receives the feedback signal having the feedback frequency f as the input signal. As previously mentioned, the voltage generation unit 1 is configured to output the feedback voltage V1 based on the input signal. Thus, the feedback voltage V1 may be proportional to the feedback frequency f.

The feedback unit 2 is further configured to calculate a voltage difference V0−V1 between the reference voltage V0 (from the reference voltage source 3) and the feedback voltage V1 (from the voltage generation unit 1). The feedback unit 2 may then adjust the feedback frequency f of the feedback signal based on the voltage difference V0−V1. Accordingly, the feedback frequency f may be adjusted to a desired frequency using the frequency generation device of FIG. 1. In addition, one of ordinary skill in the art would recognize that a feedback frequency f having a steady state can be achieved using the closed loop circuit of FIG. 1.

As a result of the closed feedback loop in FIG. 1, the feedback frequency f may be substantially equal to a predetermined target frequency f0 of the reference voltage V0 when the feedback loop achieves a steady state. Accordingly, the frequency generation device will output signals having the feedback frequency f (or predetermined target frequency f0) in the steady state.

As previously mentioned in the BACKGROUND section, a crystal oscillator typically includes a quartz crystal, which may increase the cost of the crystal oscillator. Also, the quartz crystal is fairly brittle. However, the embodiment in FIG. 1 according to the inventive concept does not require a crystal element, and can be implemented using common circuit elements. As a result, the frequency generation device of FIG. 1 may provide cost and reliability advantages compared to the crystal oscillator.

In the frequency generation device of FIG. 1, the reference voltage V0 of the reference voltage source 3 can be predetermined or calculated based on the target frequency f0. In some embodiments, the reference voltage V0 may be obtained from a circuit simulation using the target frequency f0.

Figure 2:
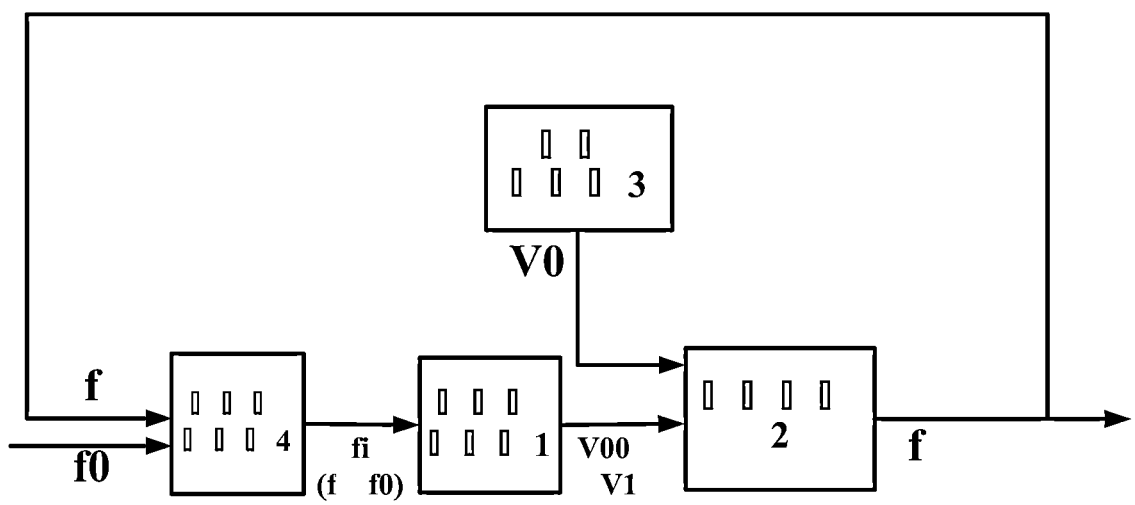
FIG. 2 is a schematic diagram illustrating a frequency generation device according to another embodiment of the inventive concept.

FIG. 2 is a schematic diagram illustrating a frequency generation device according to another embodiment of the inventive concept. FIG. 2 further illustrates an exemplary circuit configuration for determining a value of the reference voltage V0.

The frequency generation device of FIG. 2 may include a frequency selection unit 4 in addition to the elements depicted in FIG. 1.

The frequency selection unit 4 is configured to receive input signals. The input signals may include a feedback signal having a feedback frequency f and a reference signal having a reference frequency f0. The frequency selection unit 4 is configured to select an input frequency fi from one of the feedback frequency f and the reference frequency f0, depending on whether the frequency selection unit 4 is in a reference setting mode or a frequency generating mode.

When the frequency selection unit 4 is in the reference setting mode, the frequency selection unit 4 selects the reference frequency f0 of the reference signal as the input frequency fi. Accordingly, the voltage generation unit 1 receives an input signal having the input frequency fi (reference frequency f0) from the frequency selection unit 4. Next, the voltage generation unit 1 outputs to a feedback unit 2 a voltage V00 based on the reference frequency f0. The voltage V00 may be proportional to the reference frequency f0.

When the frequency selection unit 4 is in the frequency generating mode, the frequency selection unit 4 selects the feedback frequency f of the feedback signal as the input frequency fi. Accordingly, the voltage generation unit 1 receives an input signal having the input frequency fi (feedback frequency f) from the frequency selection unit 4. Next, the voltage generation unit 1 outputs to the feedback unit 2 a feedback voltage V1 based on the feedback frequency f. The feedback voltage V1 may be proportional to the feedback frequency f.

The reference voltage source 3 is configured to provide a reference voltage V0 to the feedback unit 2.

The feedback unit 2 includes a first input terminal and a second input terminal. The first input terminal of the feedback unit 2 is connected to an output terminal of the voltage generation unit 1. The second input terminal of the feedback unit 2 is connected to an output terminal of the reference voltage source 3. The feedback unit 2 is configured to receive either the voltage V00 or the feedback voltage V1 at the first input terminal, and the reference voltage V0 at the second input terminal, so as to output a feedback signal having the feedback frequency f.

In some embodiments, when the frequency selection unit 4 is in the reference setting mode, the reference voltage V0 from the reference voltage source 3 may be substantially equal to the voltage V00 output by the voltage generation unit 1 (i.e. V0=V00). As previously mentioned, the voltage V00 is generated by the voltage generation unit 1 based on the input frequency fi (reference frequency f0) when the frequency selection unit 4 is in the reference setting mode. Also, the voltage V00 may be proportional to the reference frequency f0.

The frequency selection unit 4 may include switching elements (such as field effect transistors, mechanical switches, etc.). Accordingly, the frequency selection unit 4 may output a signal having the selected frequency (feedback frequency f or reference frequency f0) to the voltage generation unit 1.

In some embodiments, when the frequency selection unit 4 is in the frequency generating mode, the reference voltage V0 from the reference voltage source 3 may be substantially equal to the feedback voltage V1 output by the voltage generation unit 1 (i.e. V0=V1). As previously mentioned, the feedback voltage V1 is generated by the voltage generation unit 1 based on the input frequency fi (feedback frequency f) when the frequency selection unit 4 is in the frequency generating mode. Also, the feedback voltage V1 may be proportional to the feedback frequency f.

As mentioned above, the reference voltage V0 can be adjusted/set to either the voltage V00 or the feedback voltage V1, depending on whether the frequency selection unit 4 is in the reference setting mode or the frequency generating mode. Accordingly, frequency errors (due to inherent characteristics in the circuit elements of the frequency generation device) can be reduced using the embodiment of FIG. 2. In particular, by using the same voltage generation unit 1 to generate the voltage V0 having the reference frequency f0 (such that V0=V00) and the feedback voltage V1 having the feedback frequency f, the frequency generation device can automatically adjust the frequencies so as to mitigate the effects of the inherent errors (of the circuit elements) on the output frequency. Accordingly, the frequency generation device of FIG. 2 may be capable of achieving a more accurate output frequency and at a lower cost (compared to the ring oscillator or the RC oscillator).

The feedback unit 2 may adjust the feedback frequency f of the feedback signal according to the voltage difference V0−V1, so as to achieve a negative feedback loop.

In some embodiments, the feedback frequency f of the feedback signal may be adjusted based on the polarity of the voltage difference V0−V1. For example, when the voltage difference V0−V1>0, the feedback frequency f of the feedback signal may be increased by a fixed amount Δf. Conversely, when the voltage difference V0−V1<0, the feedback frequency f of the feedback signal may be reduced by a fixed amount Δf. However, when the voltage difference V0−V1=0, the feedback frequency f may remain unchanged.

In some other embodiments, the feedback frequency f of the feedback signal maybe adjusted based on the polarity and the absolute value of the voltage difference V0−V1. For example, when the voltage difference V0−V1>0, the feedback frequency f of the feedback signal may be increased by an amount corresponding to the absolute value of the voltage difference V0−V1 (i.e. |V0−V1|). Conversely, when the voltage difference V0−V1<0, the feedback frequency f of the feedback signal maybe reduced by an amount corresponding to the absolute value of the voltage difference V0−V1 (i.e. |V0−V1|). However, when the voltage difference V0−V1=0, the feedback frequency f may remain unchanged.

According to some embodiments, when the frequency generation device has just been switched to the frequency generating mode, the initial feedback frequency f may have a low value (for example, zero). Since the feedback voltage V1 (generated by the voltage generation unit 1) is proportional to the feedback frequency f, the feedback voltage V1 therefore has a low value. Accordingly, the voltage difference V0−V1 is greater than zero, which results in an increase in the feedback frequency f of the feedback signal (generated by the feedback unit 2).

As the feedback unit 2 starts to oscillate, the feedback voltage V1 gradually increases and approaches V0, thereby decreasing the voltage difference V0−V1. When the feedback voltage V1 is equal to the reference voltage V0, the voltage difference V0−V1 is equal to zero, and thus the feedback frequency f of the feedback signal (output by the feedback unit 2) remains unchanged. However, if external disturbances cause the feedback voltage V1 to increase such that the feedback voltage V1 is greater than the reference voltage V0, the voltage difference V0−V1 will be less than zero. Accordingly, the feedback frequency f of the feedback signal decreases until V1=V0. Thus, when the frequency generation device is in a steady state, the feedback frequency f will reach a value corresponding to the voltage difference V1=V0.

According to some other embodiments, when the frequency generation device has just been switched to the frequency generating mode, the initial feedback frequency f may have a value that is close to the reference frequency f0. If f>f0, the feedback voltage V1 will be greater than the reference voltage V0. Accordingly, the voltage difference V0−V1 is less than zero, which results in the feedback frequency f of the feedback signal (generated by the feedback unit 2) decreasing until V1=V0. Alternatively, if f<f0, the feedback voltage V1 will be less than the reference voltage V0. Accordingly, the voltage difference V0−V1 is greater than zero, which results in the feedback frequency f of the feedback signal (generated by the feedback unit 2) increasing until V1=V0. When the frequency generation device is in a steady state, the feedback frequency f will reach a value corresponding to the voltage difference V1−V0=0.

As seen above, the feedback frequency f changes according to the voltage difference V0−V1. Since the magnitudes of the feedback voltage V1 and the feedback frequency f are correlated, the feedback frequency f is thus automatically adjusted in a closed feedback loop so that the feedback voltage V1 approaches the reference voltage V0. Accordingly, V1=V0 when the frequency generation device reaches a steady state.

Since the feedback frequency f is proportional to the feedback voltage V1, and the reference voltage V0 (or voltage V00) is proportional to the reference frequency f0, the feedback frequency f will be equal to the reference frequency f0 when the frequency generation device reaches a steady state (V1=V0). Accordingly, a highly accurate output frequency can be obtained using the above embodiments.

In contrast to the embodiments of the inventive concept, the output frequency generated by the RC oscillator may be less accurate and cannot be adjusted easily, because it is difficult to control precisely the resistance and capacitance values in the RC oscillator.

Furthermore, by using the same voltage generation unit 1 to generate the voltage V0 having the reference frequency f0 (such that V0=V00) and the feedback voltage V1 having the feedback frequency f, the frequency generation device can automatically adjust the frequencies so as to mitigate the effect of the inherent errors (of the circuit elements) on the output frequency. Accordingly, the frequency generation device of FIG. 2 is capable of achieving a more accurate output frequency and at a lower cost (compared to the ring oscillator or the RC oscillator).

Figure 3:
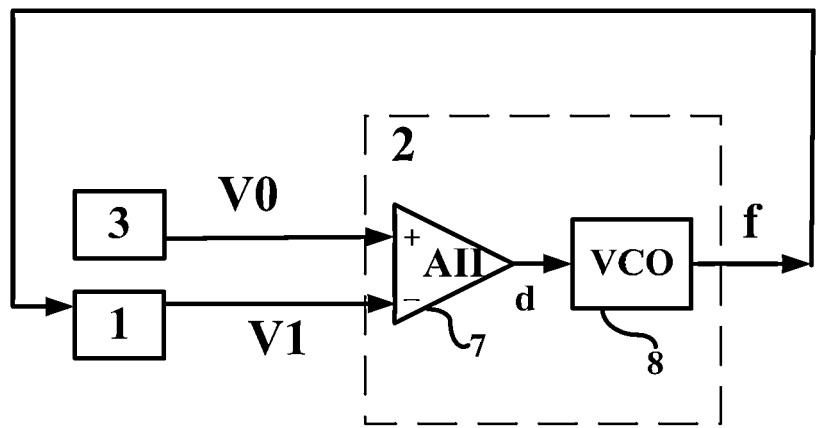
FIG. 3 is a schematic diagram depicting an exemplary feedback unit.

FIG. 3 is a schematic diagram depicting an exemplary feedback unit of a frequency generation device according to the inventive concept. As shown in FIG. 3, the feedback unit 2 may include an operational amplifier (AII) 7 and a voltage-controlled oscillator (VCO) 8.

It is noted that the example of FIG. 3 may include the different embodiments previously described with reference to FIGS. 1 and 2.

Referring to FIG. 3, the operational amplifier (AII) 7 includes a first input terminal and a second input terminal. The first input terminal of the operational amplifier (AII) 7 is connected to an output terminal of a reference voltage source 3. The second input terminal of the operational amplifier (AII) 7 is connected to an output terminal of a voltage generation unit 1.

The voltage generation unit 1 is configured to output a feedback voltage V1. The reference voltage source 3 is configured to output a reference voltage V0.

The operational amplifier (AII) 7 is configured to output a signal d based on the voltage difference between the reference voltage V0 and the feedback voltage V1 (i.e. V0–V1).

The voltage-controlled oscillator (VCO) 8 is configured to receive the signal d, and adjust a feedback frequency f of a feedback signal based on the signal d.

Although FIG. 3 illustrates the operational amplifier (AII) 7 having a non-inverting first input terminal and an inverting second input terminal, it should be noted that the inventive concept is not limited to the above-described configuration. For example, in some other embodiments, the operational amplifier (AII) 7 may have an inverting first input terminal and a non-inverting second input terminal.

Due to the closed loop characteristics of an operational amplifier, the non-inverting and inverting terminals of the operational amplifier (AII) 7 may be in short circuit when the frequency generation device is in a steady state. Thus, when the frequency generation device is in a steady state, the voltage at the second input terminal of the operational amplifier (AII) 7 (i.e. V1) may be equal to the voltage at the first input terminal of the operational amplifier (AII) 7 (i.e. V0). Since the feedback frequency f is proportional to the feedback voltage V1, and the reference voltage V0 (or voltage V00) is proportional to the reference frequency f0, the feedback frequency f will be equal to the reference frequency f0 when the frequency generation device reaches a steady state (V1=V0).

The signal d may be used to indicate the polarity of the voltage difference V0–V1. For example, when the voltage difference V0–V1>0, the signal d may be assigned a value (for example, +1) to indicate that the voltage difference V0–V1 is positive. Conversely, when the voltage difference V0–V1<0, the signal d may be assigned a value (for example, −1) to indicate that the voltage difference V0–V1 is negative. However, when the voltage difference V0–V1=0, the signal d may be assigned a value of zero to indicate that the voltage difference V0–V1 is zero.

As previously mentioned, the feedback frequency f of the feedback signal may be adjusted based on the signal d. For example, when the signal d indicates that the voltage difference V0–V1 is positive, the voltage-controlled oscillator (VCO) 8 may increase the feedback frequency f of the feedback signal by a fixed amount $\Delta f$. When the signal d indicates that the voltage difference V0–V1 is negative, the voltage-controlled oscillator (VCO) 8 may reduce the feedback frequency f of the feedback signal by a fixed amount $\Delta f$. However, when the signal d indicates that the voltage difference V0–V1 is zero, the feedback frequency f may remain unchanged.

In some embodiments, the signal d can be used to adjust the parameters of the circuit elements in the voltage-controlled oscillator (VCO) 8, so as to adjust the feedback frequency f of the feedback signal output by the voltage-controlled oscillator (VCO) 8.

In some embodiments, the signal d may be used to indicate the polarity and the absolute value of the voltage difference V0–V1. In those embodiments, the signal d need not be limited to discrete values (such as +1, −1, or 0), and may include values indicative of the absolute value of the voltage difference V0–V1. For example, the signal d may be equal to M×(V0–V1) (where M is a positive constant) which can be used to indicate whether the voltage difference V0–V1 is positive or negative as well as the absolute value of the voltage difference V0–V1 (i.e. |V0–V1|). Accordingly, the magnitude of the signal d corresponds to the magnitude of the voltage difference V0–V1.

Accordingly, the frequency of the voltage-controlled oscillator (VCO) 8 may be adjusted by an amount N×d (where N is a positive constant measured in Hz/V), which may allow the feedback voltage V1 to converge more quickly to the reference voltage V0.

The voltage-controlled oscillator (VCO) 8 may include any oscillator having a dynamic range that includes the target frequency (i.e. reference frequency f0).

Figure 4:
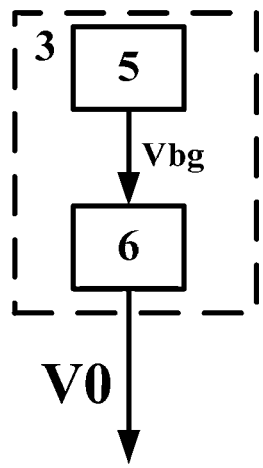
FIG. 4 is a schematic diagram illustrating an exemplary reference voltage source.

FIG. 4 is a schematic diagram illustrating an exemplary reference voltage source 3 of a frequency generation device according to the inventive concept. Referring to FIG. 4, the reference voltage source 3 may include a bandgap voltage source 5 and a resistive voltage divider unit 6.

It is noted that the example of FIG. 4 may include the different embodiments previously described with reference to FIGS. 1 to 3.

The bandgap voltage source 5 is configured to generate a constant bandgap voltage Vbg.

The resistive voltage divider unit 6 is configured to divide the bandgap voltage Vbg to obtain a reference voltage V0. The resistive voltage divider unit 6 may include a plurality of resistors connected in series (R-string).

In the embodiment of FIG. 4, since the bandgap voltage Vbg supplied by the voltage source 3 does not vary significantly with temperature and other factors, a stable reference voltage V0 can thus be obtained. In contrast, the RC oscillators in the prior art may be susceptible to changes in temperature and humidity which could affect the stability of their output frequencies.

Figure 5:
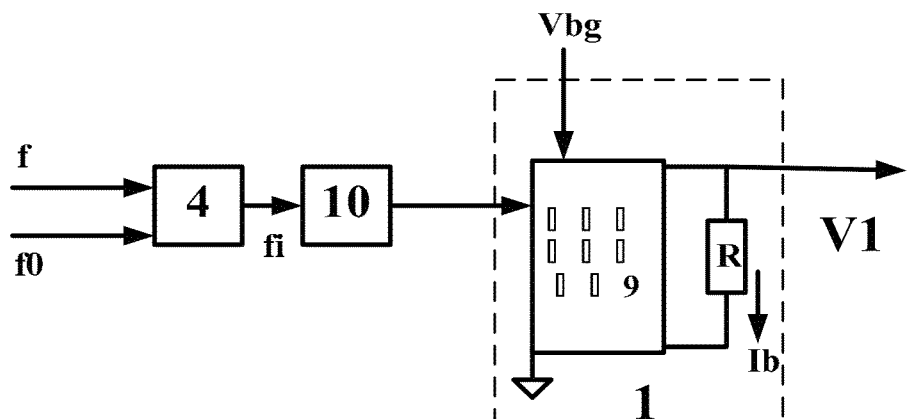
FIG. 5 is a schematic diagram illustrating a voltage generation unit according to an embodiment of the inventive concept.

FIG. 5 is a schematic diagram illustrating a voltage generation unit 1 according to another embodiment of the inventive concept.

It is noted that the example of FIG. 5 may include the different embodiments previously described with reference to FIGS. 1 to 4.

Referring to FIG. 5, the voltage generation unit 1 may include a switched-capacitor current source 9 and a resistor R. The switched-capacitor current source 9 is configured to generate a current Ib that is proportional to the bandgap voltage Vbg (generated by a bandgap voltage source 5) and the frequency fi of the voltage generation unit 1. When the current Ib flows across the resistor R, an output voltage V1 is generated by the voltage generation unit 1 (V1=Ib×R), where R corresponds to a resistance value of the resistor R.

When the frequency selection unit 4 is in the frequency generating mode (i.e. when the feedback frequency f is selected), the switched-capacitor current source 9 outputs a current Ib' that is proportional to the feedback frequency f.

When the frequency selection unit 4 is in the reference setting mode (i.e. when the reference frequency f0 is selected), the switched-capacitor current source 9 outputs a current Ib' that is proportional to the reference frequency f0.

The frequency generation device may further include a non-overlapping clock generator 10. The non-overlapping clock generator 10 is configured to generate a first clock signal PH1 and a second clock signal PH2 for driving the switched-capacitor current source 9. The first and second clock signals PH1 and PH2 are generated based on the input signal (having the input frequency fi) received from the frequency selection unit 4. As previously mentioned, the frequency selection unit 4 may select either the feedback frequency f or the reference frequency f0. In some embodiments, the first and second clock signals PH1 and PH2 have the same frequency but are out of phase. The first and second clock signals PH1 and PH2 are output to the switched-capacitor current source 9.

In the embodiment of FIG. 5, frequency errors arising due to the inherent characteristics of the circuit elements maybe mitigated by driving the switched-capacitor current source 9 (in the voltage generation unit 1) and the reference voltage source V0 using the same bandgap voltage source 5.

The switched-capacitor current source 9 may include any device capable of generating a current Ib that is proportional to the bandgap voltage Vbg and the input frequency fi. For example, a current that is proportional to an input frequency can be generated by controlling the charging and discharging time of the capacitors in a switched-capacitor current source.

Figure 6:
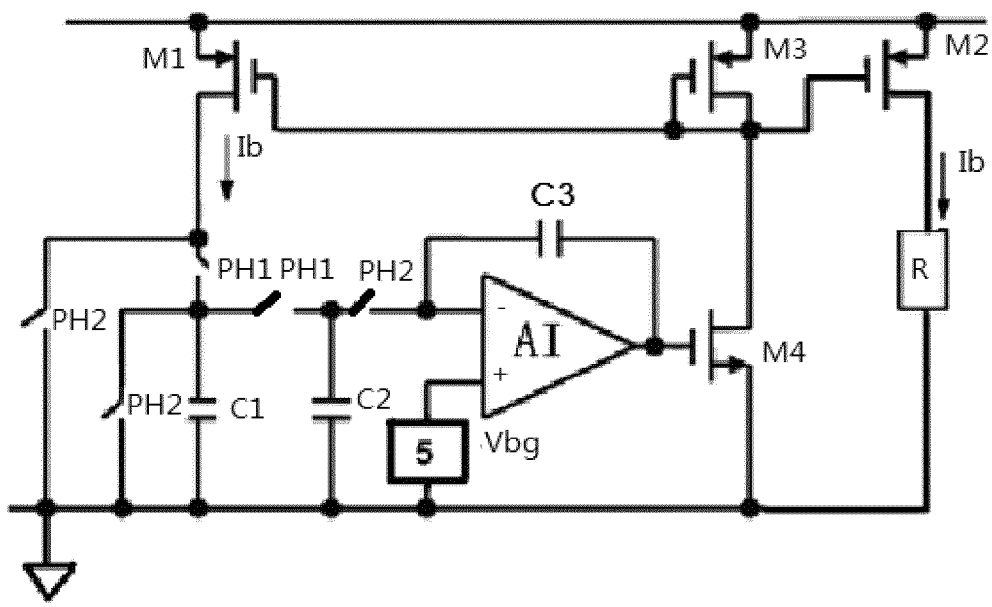
FIG. 6 is a schematic circuit diagram illustrating a switched-capacitor current source in a frequency generation device according to an embodiment of the inventive concept.

FIG. 6 is a schematic circuit diagram illustrating a switched-capacitor current source 9 of a frequency generation device according to an embodiment of the inventive concept.

Referring to FIG. 6, the switched-capacitor current source 9 includes a plurality of capacitors C1, C2, and C3. Each of the capacitors includes a corresponding capacitor discharge current. In the embodiment of FIG. 6, the capacitor C1 constitutes a discharging capacitor.

The switched-capacitor current source 9 also includes a plurality of transistors M1, M2, M3 and M4.

The switched-capacitor current source 9 further includes a plurality of switches that may be opened or closed according to the first and second clock signals PH1 and PH2.

By controlling the switches using the first and second clock signals PH1 and PH2, and by charging and discharging the capacitors C1, C2, and C3 based on the input frequency fi, the operation amplifier AI may generate a current Ib that is proportional to the bandgap voltage Vbg and the input frequency fi.

Referring to FIG. 6, it is noted that the currents flowing through the transistors M1 and M2 are the same (current mirror).

In some embodiments, the first and second clock signals PH1 and PH2 may, for example, have a duty cycle of 50%, and the current Ib may be provided as follows:

$$Ib=2 \times Vbg \times C1 \times fi$$

where fi is the input frequency of the voltage generation unit 1, C1 is the capacitance of the discharging capacitor C1, and Vbg is the bandgap voltage. When the voltage generation unit 1 is in the reference setting mode, the input frequency fi corresponds to the reference frequency f0. When the voltage generation unit 1 is in the frequency generating mode, the input frequency fi corresponds to the feedback frequency f.

As a result of the current Ib flowing through the resistor R, the voltage generation unit 1 may generate a voltage V:

$$V=Ib \times R=2 \times Vbg \times C1 \times fi \times R$$

where R is the resistance value of the resistor R.

An example of a switched-capacitor current source is described in more detail in a paper authored by B. Robert Gregoire and Un-Ku Moon, titled "A Sub 1-V Constant Gm-C Switched-Capacitor Current Source," IEEE Transactions on Circuits and Systems-II: Express Briefs, Vol. 54, No. 3, March 2007.

Figure 7:
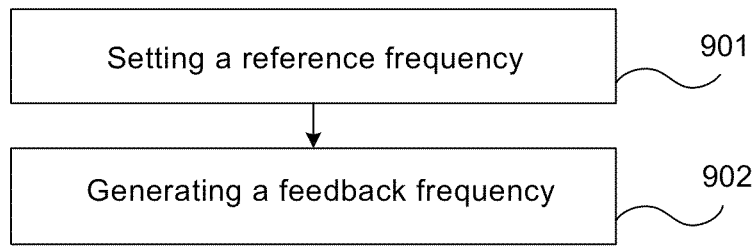
FIG. 7 is a schematic flow diagram illustrating a frequency generation method according to an embodiment of the inventive concept.

FIG. 7 is a schematic flow diagram illustrating a frequency generation method according to an embodiment of the inventive concept.

The frequency generation method of FIG. 7 may be used to generate the frequency of an oscillation frequency generation device according to the previously-described embodiments.

The frequency generation method may include setting a reference frequency (step 901) and generating a feedback frequency (step 902).

Referring to FIG. 7, setting the reference frequency (step 901) may include: (1) inputting a reference voltage V0 having a reference frequency f0 to a voltage generation unit 1; and (2) setting the reference voltage V0 equal to a voltage V00 generated by the voltage generation unit 1.

Generating the frequency (step 902) may include: (1) outputting a feedback voltage V1 from the voltage generation unit 1 to a feedback unit 2; and (2) outputting a feedback signal (having the feedback frequency f) from the feedback unit 2, wherein the feedback frequency f is proportional to the feedback voltage V1, and the feedback frequency f is adjusted based on the difference between a reference voltage V0 from a reference voltage source 3 and the feedback voltage V1 from the voltage generation 1 (i.e. V0−V1).

As previously described, when the voltage difference V0−V1 is greater than zero, the feedback frequency f of the feedback signal from the feedback unit 2 may be increased. Conversely, when the voltage difference V0−V1 is less than zero, the feedback frequency f of the feedback signal from the feedback unit 2 may be decreased. When the voltage difference V0−V1 is equal to zero, the feedback frequency f of the feedback signal from the feedback unit 2 remains unchanged.

Figure 8:
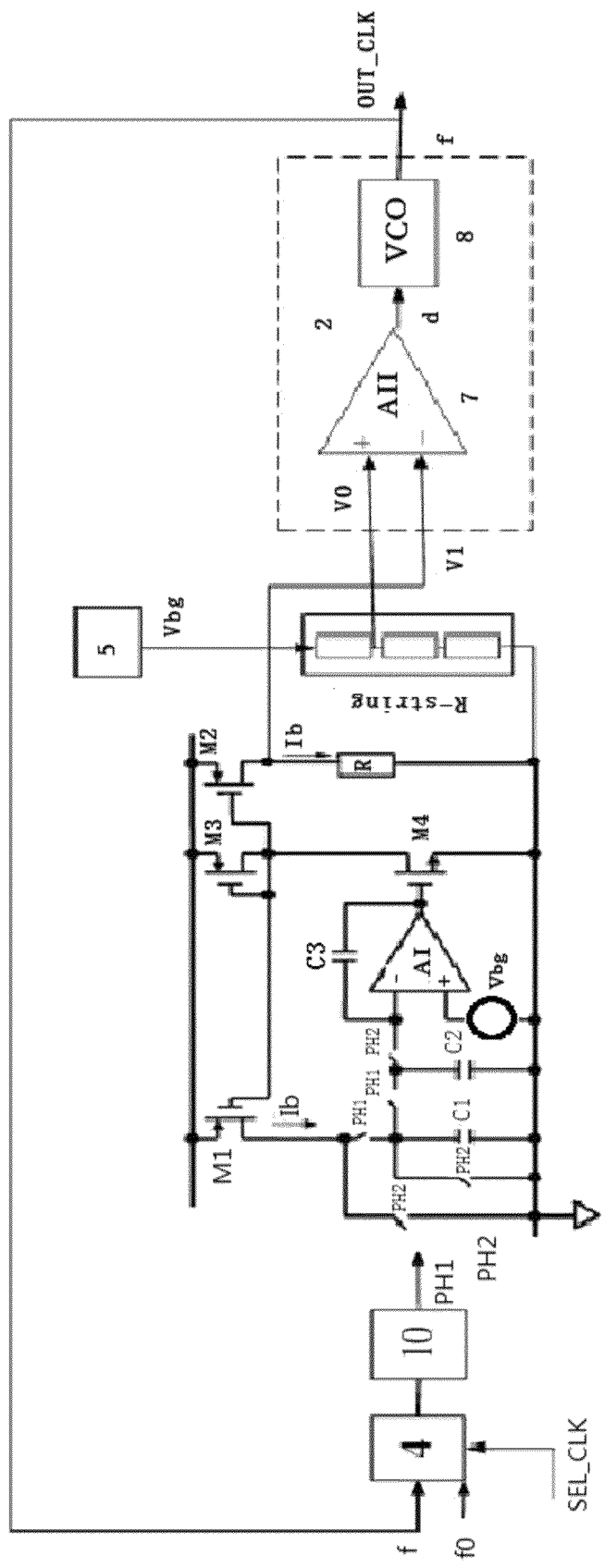
FIG. 8 is a schematic diagram illustrating a frequency generation device according to a further embodiment of the inventive concept.

FIG. 8 is a schematic diagram illustrating a frequency generation device according to a further embodiment of the inventive concept. The frequency generation device of FIG. 8 includes the switched-capacitor current source of FIG. 6.

In the example of FIG. 8, the frequency generation device is configured to generate a target frequency having the reference frequency f0.

When the frequency generation device is in the reference frequency setting mode, the frequency selection unit 4 selects the reference frequency f0 of an input signal. The non-overlapping clock generator 10 then outputs a clock signal having the reference frequency f0 (that is out of phase to the input signal) to an input terminal of a voltage generation unit 1. In the example of FIG. 8, the input terminal of a voltage generation unit 1 corresponds to an input terminal of the switched-capacitor current source 9.

After the switched-capacitor current source 9 receives the non-overlapping clock signal having the reference frequency f0, the switched-capacitor current source 9 generates a current Ib:

$$Ib=2 \times Vbg \times C1 \times f0$$

Also, the voltage generation unit 1 generates a voltage V00:

$$V00=Ib \times R=2 \times Vbg \times C1 \times f0 \times R$$

In the embodiment of FIG. 8, the value of the voltage V00 may be obtained using an analog-to-digital converter (ADC). The ADC may also be used to obtain the value of the bandgap voltage Vbg generated by the bandgap voltage unit 5.

In the example of FIG. 8, the divider unit 5 may include a resistive voltage divider comprising a plurality of resistors connected in series. Based on a ratio of the voltage V00 to the bandgap voltage Vbg, the divider unit 5 may adjust the voltages such that the voltage V00 is equal to the reference voltage V0. The reference voltage V0 is then input to a first input terminal of the feedback unit 2. In the example of FIG. 8, the first input terminal of the feedback unit 2 corresponds to the non-inverting input of the operation amplifier (AII) 7.

Subsequently, the frequency generation device enters the frequency generation mode when the frequency selection unit 4 selects the feedback frequency f of the feedback signal (received from the feedback unit 2). The non-overlapping clock generator 10 then outputs a clock signal having the feedback frequency f (that is out of phase to the feedback signal) to the input terminal of the voltage generation unit 1. As previously mentioned, the input terminal of the voltage generation unit 1 corresponds to the input terminal of the switched-capacitor current source 9 in the example of FIG. 8.

After the switched-capacitor current source 9 receives the non-overlapping clock signal having the feedback frequency f, the switched-capacitor current source 9 generates a current Ib':

$$I' = 2 \times Vbg \times C1 \times f$$

Also, the voltage generation unit 1 generates a feedback voltage V1:

$$V1 = Ib' \times R = 2 \times Vbg \times C1 \times f \times R$$

Since the second input terminal of the feedback unit 2 is connected to the output terminal of the voltage generation unit 1, the feedback voltage V1 is therefore input to the second input terminal of the feedback unit 2. In the example of FIG. 8, the second input terminal of the feedback unit 2 corresponds to the inverting input terminal of the operational amplifier (AII) 7.

In the example of FIG. 8, the reference voltage V0 is input to the non-inverting terminal of the operational amplifier (AII) 7, and the feedback voltage V1 is input to the inverting terminal of the operational amplifier (AII) 7.

As previously mentioned, during the initial stage of oscillation (when V0−V1>0), the operational amplifier 7 outputs a signal indicating V0−V1>0. Accordingly, the voltage-controlled oscillator (VCO) 8 will increase the feedback frequency f.

Since the frequency f is proportional to the feedback voltage V1, and as a result of the increase in the feedback frequency f, the feedback voltage V1 also increases, which decreases the voltage difference V0−V1.

When the voltage difference V0−V1=0 (i.e. the feedback voltage V1 is equal to the reference voltage V0), the operational amplifier (AII) 7 outputs a signal indicating the voltage difference V0−V1=0, so that the feedback frequency f output by the voltage-controlled oscillator (VCO) 8 remains unchanged.

Since the same voltage generation unit 1 may generate a voltage V00 or a feedback voltage V1 based on the feedback frequency f0 and the reference frequency f0, the feedback frequency f will be equal to the reference frequency f0 when the feedback voltage V1 is equal to the reference voltage V0. Thus, when the frequency generation device is in a steady state, the feedback frequency (output by the feedback unit 2) is equal to the target frequency (reference frequency f0).

Figure 9:
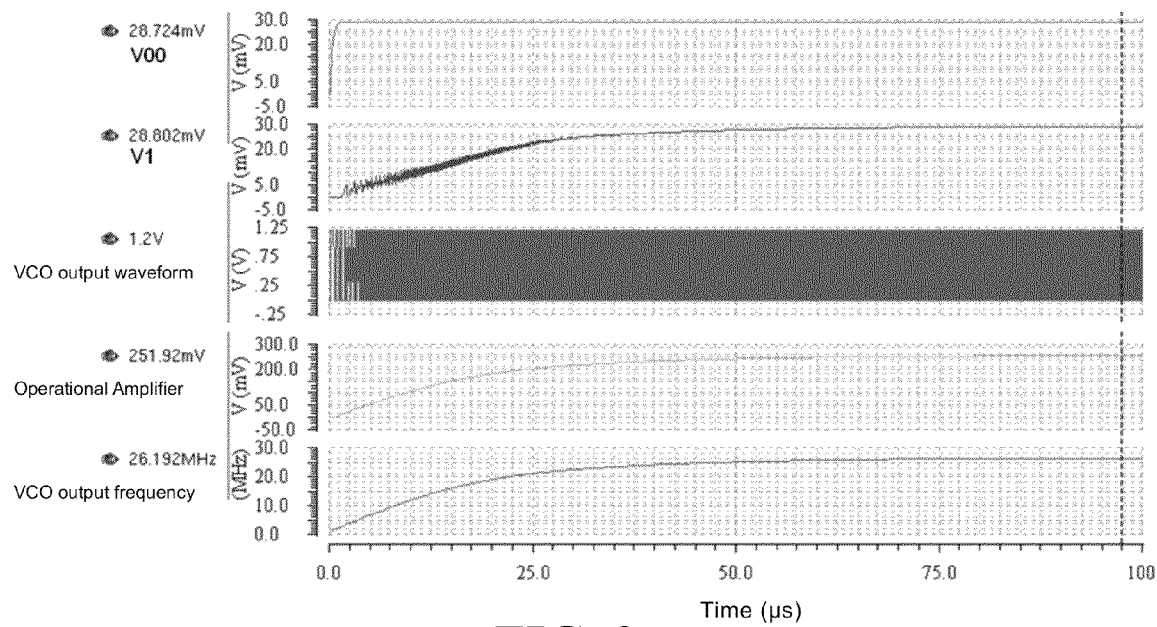
FIG. 9 is a simulated waveform diagram of the frequency generated by the frequency generation device according to an embodiment of the inventive concept.

FIG. 9 is a simulated waveform diagram of the frequency generated by the frequency generation device of FIG. 8 according to an embodiment of the inventive concept.

In the simulation of FIG. 9, when the reference frequency is 26 Mhz, the frequency generation device according to the inventive concept may be capable of generating an output frequency of about 26.192 Mhz (which is within ±1% of the reference frequency). In contrast, the accuracy of the output frequency of a ring oscillator or RC oscillator is within ±50% of the reference frequency (before trimming) and within ±5% of the reference frequency (after trimming). Accordingly, a highly accurate and stable output frequency may be obtained using the exemplary frequency generation device of FIG. 8 compared to the existing oscillators in the prior art.

As shown in FIG. 9, when the output signal generated by the operational amplifiers increases in magnitude, the feedback voltage V1 approaches the reference voltage V0. Accordingly, the feedback frequency f (generated by the voltage-controlled oscillator (VCO) 8) rapidly approaches the reference frequency f0. Thus, the exemplary frequency generation device allows an accurate oscillation signal to be generated quickly.

It is noted that the frequency generation device according to the inventive concept may include anyone of the preceding embodiments, or any combination of the preceding embodiments. The frequency generation device may be configured to output a feedback signal (having a feedback frequency) as an output signal. In particular, the output signal may correspond to the feedback signal when the frequency generation device is in a steady state.

The frequency generation device may include a DC-AC converter, or any device capable of transmitting a frequency signal (e.g. a mobile phone).

It is noted that some details may have been omitted to avoid obscuring the inventive concept. Nonetheless, the inventive concept should be apparent to one of ordinary skill in the art based on the aforementioned description with reference to the drawings.

The elements in the different embodiments of the inventive concept may be applied interchangeably, and may be implemented using any combination of software, hardware, and/or firmware.

It is further noted that the above sequence of steps in the exemplary method is merely illustrative in nature, and need not be performed in particular order unless otherwise specified.

In some embodiments, the inventive concept may be implemented as a program recorded in a recording medium, and the program includes readable instructions that are executable by a machine.

While the inventive concept has been described with reference to different embodiments, it is noted that the present disclosure is not limited to the above embodiments, and the embodiments may be modified without departing from the scope and spirit of the present disclosure. The scope of the following claims is to be accorded the broadest interpretation, which encompasses all modifications and equivalent structures and functions.

What is claimed is:

1. A frequency generation device comprising:
   a voltage generation unit configured to generate a first voltage based on a reference frequency and configured to generate a feedback voltage based on a first feedback frequency;
   a reference voltage source configured to provide a reference voltage that is equal to the first voltage, wherein the reference voltage source comprises a resistive voltage divider unit and a bandgap voltage source; and
   a feedback unit connected to the voltage generation unit and the reference voltage source, wherein a first input terminal of the feedback unit is configured to receive the reference voltage from the reference voltage source, wherein a second input terminal of the feedback unit is configured to receive the feedback voltage from the voltage generation unit, and wherein the feedback unit is configured to generate a feedback signal having a second feedback frequency based on both the reference voltage and the feedback voltage.

2. The frequency generation device of claim 1, wherein the feedback signal is provided to the voltage generation unit, and wherein the feedback unit is configured to generate the second feedback frequency by adjusting the first feedback frequency based on a difference between the reference voltage and the feedback voltage.

3. The frequency generation device of claim 1, further comprising:
a frequency selection unit configured to select from one of the first feedback frequency and the reference frequency, depending on whether the frequency selection unit is in a reference setting mode or a frequency generating mode.

4. The frequency generation device of claim 3, wherein the frequency selection unit is configured to select the reference frequency when the frequency selection unit is in the reference setting mode, and wherein the voltage generation unit is configured to receive a signal having the reference frequency from the frequency selection unit and to output the first voltage to the feedback unit based on the reference frequency.

5. The frequency generation device of claim 4, wherein the frequency selection unit is configured to select the first feedback frequency when the frequency selection unit is in the frequency generating mode, and wherein the voltage generation unit is configured to receive a signal having the first feedback frequency from the frequency selection unit and to output the feedback voltage to the feedback unit based on the first feedback frequency.

6. The frequency generation device of claim 1, wherein the reference voltage source is configured to generate the reference voltage based on the first voltage and a bandgap voltage.

7. The frequency generation device of claim 2, wherein the feedback unit is configured to: setting the second feedback frequency to be greater than the first feedback frequency by a predetermined amount when the difference between the reference voltage and the feedback voltage is greater than zero, and setting the second feedback frequency to be less than the first feedback frequency by the predetermined amount when the difference between the reference voltage and the feedback voltage is less than zero.

8. The frequency generation device of claim 7, wherein the second feedback frequency is equal to the first feedback frequency when the difference between the reference voltage and the feedback voltage is substantially equal to zero.

9. The frequency generation device of claim 1, wherein the feedback unit further comprises:
an operational amplifier connected to the reference voltage source and the voltage generation unit, wherein the operation amplifier is configured to output an indicating signal based on a voltage difference between the reference voltage and the feedback voltage; and
a voltage-controlled oscillator configured to receive the indicating signal and to generate an output frequency based on the indicating signal.

10. The frequency generation device of claim 9, wherein the indicating signal is used to indicate whether the voltage difference between the reference voltage and the feedback voltage is positive, negative, or zero.

11. The frequency generation device of claim 10, wherein the voltage-controlled oscillator is configured to: setting the second feedback frequency to be greater than the first feedback frequency by a predetermined amount when the indicating signal indicates that the voltage difference between the reference voltage and the feedback voltage is positive, and setting the second feedback frequency to be less than the first feedback frequency by the predetermined amount when the indicating signal indicates that the voltage difference between the reference voltage and the feedback voltage is negative.

12. The frequency generation device of claim 1, wherein the bandgap voltage source is configured to generate a constant bandgap voltage, and wherein the resistive voltage divider is configured to use the constant bandgap voltage to obtain the reference voltage.

13. The frequency generation device of claim 12, wherein the voltage generation unit further includes:
a switched-capacitor current source and a resistor, wherein the switched-capacitor current source is configured to generate a current that is proportional to the constant bandgap voltage and an input frequency of the voltage generation unit, and wherein the voltage generation unit is configured to generate the feedback voltage when the current flows across the resistor; and
a non-overlapping clock generator configured to generate a first clock signal and a second clock signal for driving the switched-capacitor current source, wherein the first clock signal and the second clock signal are generated based on an input signal having the input frequency received from a frequency selection unit.

14. The frequency generation device of claim 13, wherein the switched-capacitor current source comprises a plurality of capacitors including a discharging capacitor, and wherein the current generated by the switched-capacitor current source is given by: $Ib = 2 \times Vbg \times C1 \times fi$, where Ib corresponds to the current generated by the switched-capacitor current source, Vbg corresponds to the constant bandgap voltage, C1 corresponds to a capacitance value of the discharging capacitor, and fi corresponds to the input frequency.

15. A method of generating an output frequency using a frequency generation device, the method comprising:
providing a signal having a reference frequency to a voltage generation unit;
generating a first voltage based on the reference frequency using the voltage generation unit;
setting, using a reference voltage source that comprises a resistive voltage divider unit and a bandgap voltage source, a reference voltage to be equal to the first voltage;
providing the reference voltage to a feedback unit;
providing a feedback voltage from the voltage generation unit to the feedback unit; and
generating a feedback signal having a feedback frequency based on the reference voltage and the feedback voltage using the feedback unit.

16. The method of claim 15, comprising: adjusting the feedback frequency of the feedback signal based on a difference between the reference voltage and the feedback voltage.

17. The method of claim 16, further comprising: increasing the feedback frequency of the feedback signal by a predetermined amount when the difference between the reference voltage and the feedback voltage is greater than zero, and decreasing the feedback frequency of the feedback signal decreases by the predetermined amount when the difference between the reference voltage and the feedback voltage is less than zero.

18. The method of claim 17, wherein the feedback frequency of the feedback signal remains unchanged when the difference between the reference voltage and the feedback voltage is substantially equal to zero.

19. A non-transitory computer-readable medium storing instructions that, when executed, causes a frequency generation device to perform a method for generating an output frequency, the method comprising:
- providing a signal having a reference frequency to a voltage generation unit;
- generating a first voltage based on the reference frequency using the voltage generation unit;
- setting, using a reference voltage source that comprises a resistive voltage divider unit and a bandgap voltage source, a reference voltage to be equal to the first voltage;
- providing the reference voltage to a feedback unit;
- providing a feedback voltage from the voltage generation unit to the feedback unit; and
- generating a feedback signal having a feedback frequency based on the reference voltage and the feedback voltage using the feedback unit.

20. The non-transitory computer-readable medium of claim 19, wherein the method comprising: adjusting the feedback frequency of the feedback signal based on a difference between the reference voltage and the feedback voltage.

21. The frequency generation device of claim 10, wherein the second feedback frequency is equal to the first feedback frequency when the indicating signal indicates that the voltage difference between the reference voltage and the feedback voltage is substantially equal to zero.

\* \* \* \* \*